United States Patent
Huang

(10) Patent No.: US 7,843,193 B2
(45) Date of Patent: Nov. 30, 2010

(54) SYSTEM FOR TESTING MAGNETIC SENSITIVITY OF HALL-EFFECT SWITCH

(75) Inventor: Qian Huang, Waterloo (CA)

(73) Assignee: Research in Motion Limited, Waterloo, Ontario (CA)

( * ) Notice: Subject to any disclaimer, the term of this patent is extended or adjusted under 35 U.S.C. 154(b) by 532 days.

(21) Appl. No.: 11/859,020

(22) Filed: Sep. 21, 2007

(65) Prior Publication Data

US 2009/0079425 A1    Mar. 26, 2009

(51) Int. Cl.
G01R 33/06    (2006.01)
(52) U.S. Cl. .................................... 324/251
(58) Field of Classification Search ............... 324/251
See application file for complete search history.

(56) References Cited

U.S. PATENT DOCUMENTS

| | | | |
|---|---|---|---|
| 4,084,135 A | | 4/1978 | Enabnit |
| 4,295,118 A | | 10/1981 | Herr et al. |
| 4,514,687 A | * | 4/1985 | Van Husen .................. 324/537 |
| 4,692,697 A | | 9/1987 | Bray |
| 5,644,226 A | | 7/1997 | Aoyama et al. |
| 6,249,200 B1 | | 6/2001 | Stelter et al. |
| 6,750,644 B1 | | 6/2004 | Berkcan |
| 7,345,470 B2 | * | 3/2008 | Suzuki ........................ 324/202 |
| 7,492,178 B2 | * | 2/2009 | Bidenbach et al. .......... 324/763 |
| 2006/0049823 A1 | | 3/2006 | Suzuki |

FOREIGN PATENT DOCUMENTS

| | | | |
|---|---|---|---|
| EP | 0508794 | | 10/1992 |
| FR | 2796725 | | 1/2001 |
| JP | 09-050601 | * | 2/1997 |

OTHER PUBLICATIONS

Answers.com, et al., "Magnet—Definition and Much More", Answers.com.
Dogueri, Kerem, Extended European Search Report for EP 07116986.6, May 8, 2008.
Dogueri, Kerem, Second Exam Report for EP 07116986.6 Apr. 7, 2009.

* cited by examiner

*Primary Examiner*—Jay M Patidar
(74) *Attorney, Agent, or Firm*—Integral Intellectual Property Inc.; Miriam Paton

(57) ABSTRACT

A system and method for determining the magnetic sensitivity of a Hall-effect switch through the use of a variable powered DC electromagnet having a permanent magnet attached to it. In use the electromagnet is placed in contact with a Hall-effect switch component and the DC voltage varied until a detector determines the Hall-effect switch has been triggered. The electromagnet is then moved to be in contact with a probe connected to a Gauss meter to determine the magnetic sensitivity of the Hall-effect switch.

19 Claims, 4 Drawing Sheets

SYSTEM FOR TESTING MAGNETIC SENSITIVITY OF HALL-EFFECT SWITCH

BACKGROUND

Hall-effect switches may be used in a device to determine when power should be shut down to the device when the Hall-effect switch is close to a magnet. Many manufacturers provided Hall-effect switches. For the purpose of quality control in manufacturing a device utilizing a Hall-effect switch there is a need to test the sensitivity and accuracy of the switch to the strength of a specific magnetic field. The embodiments of the invention as disclosed herein address this need.

BRIEF DESCRIPTION OF THE DRAWINGS

Embodiments are illustrated by way of example and without limitation in the figures of the accompanying drawings, in which like reference numerals indicate corresponding, analogous or similar elements, and in which.

DETAILED DESCRIPTION

In testing Hall-effect switches a magnetic field is applied to the switch and the magnetic field is changed until the state of the output of the switch moves from "high" to "low". To provide a strong electromagnetic field requires a large amount of Direct Current (DC) which is taxing on many power supplies. To resolve this problem, an electromagnet connected to an adjustable power supply is provided with a permanent magnet to test the switch. This results in significantly less DC required from the power supply. By varying the DC from the power supply, it is now possible to apply "fine tuning" on the strength of the magnetic field.

Figure 1:
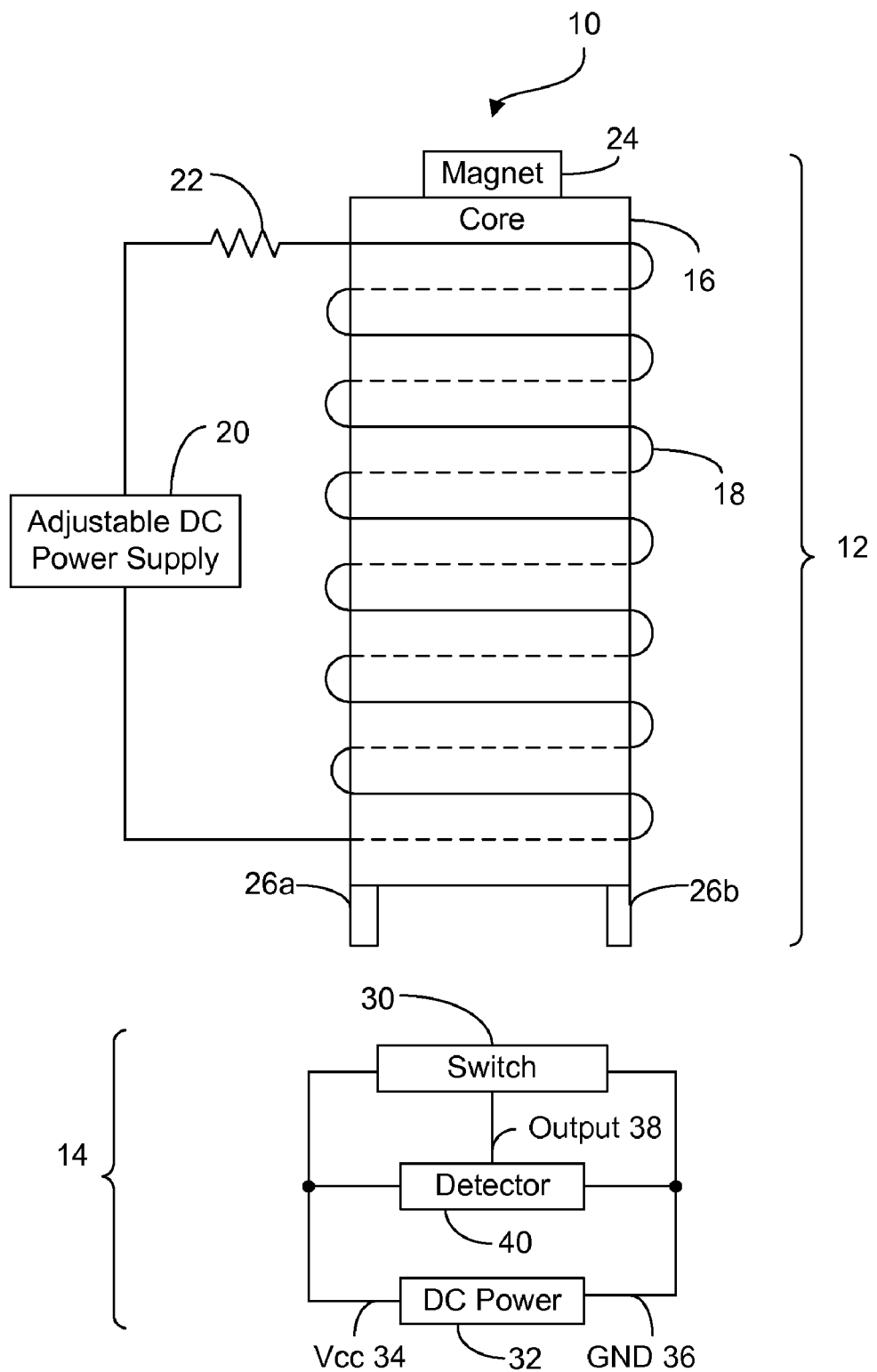
FIG. 1 is a plan view of an embodiment of a system for testing a Hall-effect switch.

Referring now to FIG. 1 a plan view of an embodiment of a system for testing a Hall-effect switch is shown generally as 10. System 10 illustrates two components; an electromagnetic coil component 12 and a Hall-effect switch component 14. Component 12 comprises a core 16, typically a ferromagnetic material, but any magnetic conductive material may be used. Core 16 is wrapped in a continuous series of wire coils 18. As one skilled in the art can appreciate electromagnets can be constructed in numerous sizes with varying materials. The magnetic field inside an electromagnet is defined as:

$$B = \mu NI/L$$

where:

B is the magnetic flux density (magnetic induction) in the core 16, measured in Telsas where one Telsa equals 10,000 Gauss;

$\mu$ (Mu) is the permeability of core 16, measured in Henries per meter;

N is the number of turns of wire around the core 16;

I is the current in amperes; and

L is the length of the electromagnet.

An embodiment utilized by the inventor had the following characteristics. The core 16 was a Murata FSRC280060RX000T. The number of turns of wire was on the order of 400 and the diameter of the wire was approximately 0.2 mm. The length of the electromagnet 12 was about 25 mm.

Electromagnet 12 receives power to coils 18 via adjustable DC power supply 20. The power supply 20 utilized by the inventor had a range of 0 to 30 volts. Resistor 22 serves as a current limiter. In the embodiment utilized by the inventor the resistor was 470 Ohm/1 Watt. Attached to the top of electromagnet 12 is a permanent magnet 24.

In one embodiment, the permanent magnet utilized was a N45 sintered NdFeB (neodymium) magnet manufactured by the Hua Zing Manufacturing Company. This magnet has a residual induction of 13.7K to 11.3K Gauss.

At the base of the electromagnet 12 are non-magnetic stops 26a and 26b. Stops 26a and 26b aid the user in aligning the electromagnet 12 with Hall-effect switch 30.

Hall-effect switch component 14 comprises a Hall-effect switch 30, a DC power source 32 and a detector 40. Hall-effect switch 30 is interchangeable within Hall-effect switch component 14 so that different switches may be tested. Switch 30 may, for example, be soldered to switch component 14. In another example, switch 30 may be placed in a receptacle matching the dimension of switch 30. When switch 30 is in contact with electromagnet 12 the magnetic sensitivity of switch 30 may be tested. Switch 30 is powered by a DC power supply 32 via Vcc 34 and GND 36. In addition DC power supply 32 is connected to detector 40 through Vcc 34 and GND 36. DC power supply 32 may comprise a battery or other DC power source.

Once in contact with electromagnet 12, switch 30 through the use of output line 38 provides output on magnetic sensitivity to detector 40. Detector 40 provides visual or audio confirmation to the user when the state of switch 30 changes.

Figure 2:
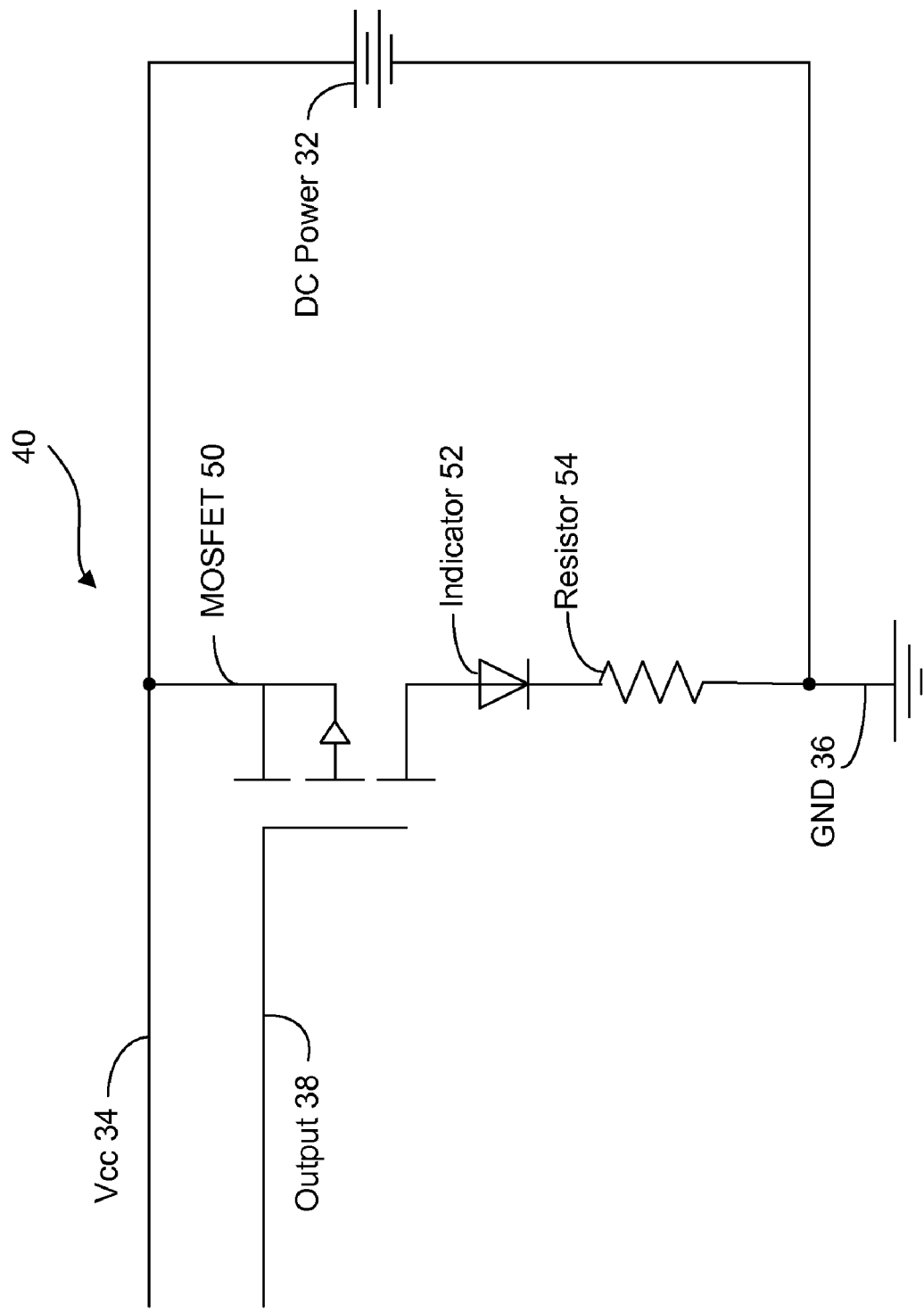
FIG. 2 is a schematic diagram of a magnetic sensitivity detector.

Referring now to FIG. 2 a schematic diagram of a magnetic sensitivity detector is shown. FIG. 2 illustrates in further detail detector 40 of FIG. 1. Detector 40 receives power from DC Power 32 and is connected to ground 36 and Vcc 34 of power supply 32. Detector 40 is further connected to Hall-effect switch 30 via output 38. When the output of Hall-effect switch 30 changes to a state of "low", MOSFET 50 activates indicator 52 to advise the user. Indicator 52 may take the form of an LED or a sound chime IC. Resistor 54 serves to limit current through indicator 52.

Figure 3:
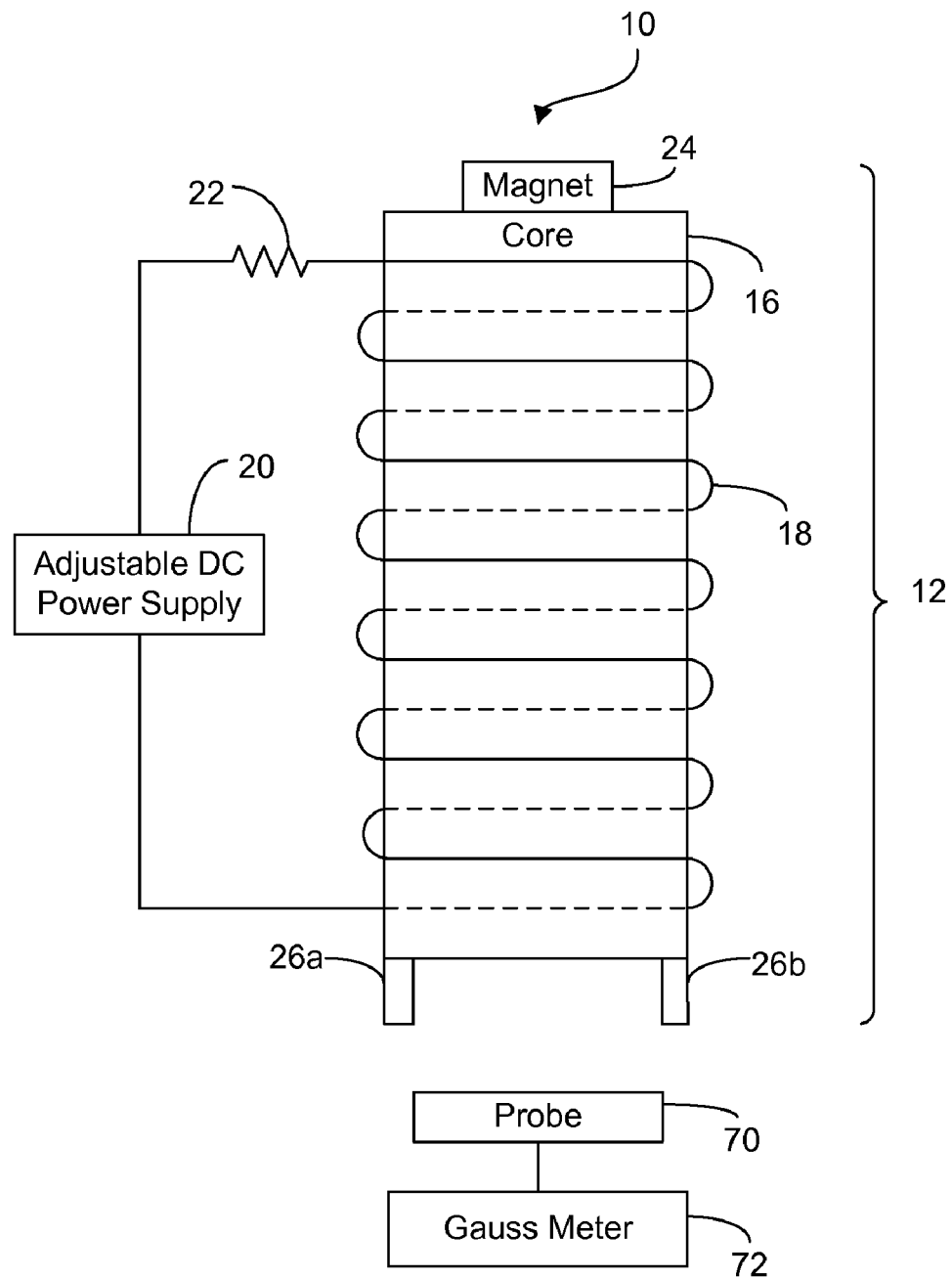
FIG. 3 is a plan view of an electromagnet connected to a Gauss meter.

Referring now to FIG. 3 a plan view of an electromagnet connected to a Gauss meter is shown. Electromagnet 12 and its associated components are identical to those of FIG. 1. In use, once detector 40 has indicated to the user that switch 30 has been triggered, i.e. its output has changed to low, the user moves the electromagnet 12 to magnetic sensitivity verifier probe 70. Magnetic sensitivity verifier probe 70 may utilize a Gauss meter 72 such as the model 410 provided by Lakeshore Cryotronics Inc. Gauss meter 72 provides a reading on the magnetic sensitivity of electromagnet 12

Figure 4:
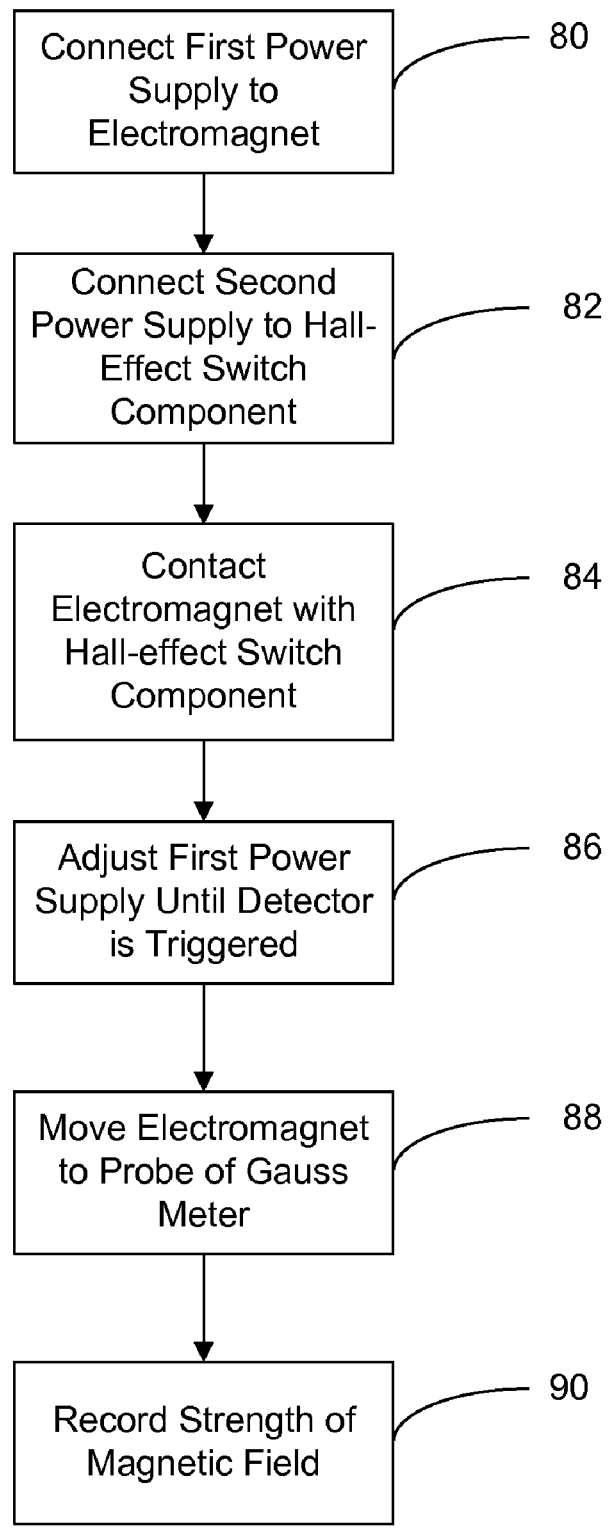
FIG. 4 is a flowchart of the process for testing the magnetic sensitivity of a Hall-effect switch.

Referring now to FIG. 4 a flowchart of the process for testing the strength of the magnetic field for a Hall-effect switch is shown. To aid the reader in following the steps we refer to the components of FIGS. 1 and 3. Beginning at step 80 electromagnet 12 is connected to adjustable DC power supply 20. At step 82, a Hall-effect switch 30 is placed in Hall-effect switch component 14. This may be done by various means, including soldering or by placing the switch in a receptacle designed for the switch. Further at step 82, a DC power supply 32, which may comprise a battery is connected to switch 30 and detector 40 of Hall-effect switch component 14. At step 84 electromagnet 12 is connected to Hall-effect switch component 14. At step 86 power supply 20 is adjusted until detector 40 is triggered. At step 88 electromagnet 12, while still connected to power supply 20 is moved to contact magnetic sensitivity verifier probe 70. Finally at step 90 the magnetic sensitivity as indicated by gauss meter 72 is recorded.

Although one example of the use of an embodiment of the present invention is for testing Hall-effect switches, use of an electromagnet with a permanent magnet as disclosed may be utilized in other fields when determining magnetic sensitivity for a specific amount of magnetic field strength is required.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

I claim:

1. A system for testing the magnetic sensitivity of a Hall-effect switch, the system comprising:
   a subsystem for creating a magnetic field in which the Hall-effect switch is to be tested, the subsystem comprising:
      an electromagnet;
      a permanent magnet attached to the electromagnet; and
      a first adjustable direct current (DC) power supply connected to the electromagnet to provide power to the electromagnet;
   a probe connected to a Gauss meter to measure the magnetic field created by the subsystem; and
   a Hall-effect switch component for receiving the Hall-effect switch, wherein the Hall-effect switch component is able to indicate, when the Hall-effect switch is magnetically coupled to the electromagnet and to the permanent magnet, whether the Hall-effect switch has been triggered.

2. The system of claim 1, wherein the Hall-effect switch component comprises:
   a detector that is connectable to an output of the Hall-effect switch and is arranged to detect changes in state of the output; and
   a second DC power supply arranged to provide power to the Hall-effect switch and to the detector.

3. The system of claim 2, wherein the detector comprises:
   a metal-oxide semiconductor field-effect transistor (MOSFET) connected to the second DC power supply and to the output of the Hall-effect switch;
   an indicator connected to the MOSFET; and
   a resistor connected to the indicator.

4. The system of claim 3, wherein the indicator comprises:
   a light emitting diode (LED) to indicate when the Hall-effect switch has been triggered.

5. The system of claim 3, wherein the indicator comprises:
   an integrated circuit (IC) to generate an audible signal when the Hall-effect switch has been triggered.

6. The system of claim 1, further comprising:
   a current limiting resistor between the first adjustable DC power supply and the electromagnet.

7. The system of claim 1, wherein the Hall-effect switch component comprises:
   a receptacle for receiving the Hall-effect switch.

8. The system of claim 1, wherein the subsystem further comprises:
   non-magnetic stops to aid in aligning the Hall-effect switch with the subsystem.

9. A method for testing the magnetic sensitivity of a Hall-effect switch, the method comprising:
   providing power to an electromagnet to generate a first magnetic field component, wherein a permanent magnet having a second magnetic field component is attached to the electromagnet;
   aligning the Hall-effect switch with the electromagnet, such that the electromagnet is located between Hall-effect switch and the permanent magnet, thus magnetically coupling the Hall-effect switch to the electromagnet and to the permanent magnet; and
   providing power to the Hall-effect switch and monitoring a response of the Hall-effect switch to a magnetic field having the first magnetic field component and the second magnetic field component.

10. The method of claim 9, wherein aligning the Hall-effect switch with the electromagnet comprises:
    aligning the Hall-effect switch with the electromagnet using non-magnetic stops.

11. The method of claim 9, wherein providing power to the electromagnet comprises:
    limiting current to the electromagnet.

12. The method of claim 9, wherein monitoring the response of the Hall-effect switch to the magnetic field comprises:
    monitoring an output of the Hall-effect switch for a change in a state of the output.

13. The method of claim 12, further comprising:
    increasing strength of the first magnetic field component to a level at which the change is detected; and
    while strength of the first magnetic field component is at the level, measuring intensity of the magnetic field where the Hall-effect switch was positioned relative to the electromagnet and the permanent magnet when the change was detected.

14. The method of claim 13, wherein measuring the intensity comprises:
    positioning a probe where the Hall-effect switch was positioned relative to the electromagnet and the permanent magnet when the change was detected; and
    measuring output of the probe with a Gauss meter.

15. An apparatus for testing the magnetic sensitivity of a Hall-effect switch, the system comprising:
    a subsystem for creating a magnetic field in which the Hall-effect switch is to be tested, the subsystem comprising:
       an electromagnet;
       a permanent magnet attached to the electromagnet; and
       means for connecting the electromagnet to a first adjustable direct current (DC) power supply; and
    a Hall-effect switch component for receiving the Hall-effect switch, wherein the Hall-effect switch component is able to indicate, when the Hall-effect switch is magnetically coupled to the electromagnet and to the permanent magnet, whether the Hall-effect switch has been triggered.

16. The apparatus of claim 15, wherein the Hall-effect switch component comprises:
    a detector that is connectable to an output of the Hall-effect switch and is arranged to detect changes in state of the output; and
    means for connecting the Hall-effect switch and the detector to a second DC power supply.

17. The apparatus of claim 16, wherein the detector comprises:
   a metal-oxide semiconductor field-effect transistor (MOSFET) connected to the second DC power supply and to the output of the Hall-effect switch;
   an indicator connected to the MOSFET; and
   a resistor connected to the indicator.

18. The apparatus of claim 17, wherein the indicator comprises:
   a light emitting diode (LED) to indicate when the Hall-effect switch has been triggered.

19. The apparatus of claim 15, further comprising:
   a current limiting resistor between the first adjustable DC power supply and the electromagnet.

* * * * *

UNITED STATES PATENT AND TRADEMARK OFFICE
CERTIFICATE OF CORRECTION

| | | |
|---|---|---|
| PATENT NO. | : 7,843,193 B2 | Page 1 of 1 |
| APPLICATION NO. | : 11/859020 | |
| DATED | : November 30, 2010 | |
| INVENTOR(S) | : Qian Huang | |

It is certified that error appears in the above-identified patent and that said Letters Patent is hereby corrected as shown below:

Title Page; item (54) and Col. 1, lines 1-2;

The title should be "System to Test Magnetic Sensitivity of Hall-Effect Switch"

Signed and Sealed this
Eighteenth Day of January, 2011

David J. Kappos
*Director of the United States Patent and Trademark Office*